United States Patent
Hong et al.

(10) Patent No.: US 11,437,837 B2
(45) Date of Patent: Sep. 6, 2022

(54) STARTING BATTERY DRIVING SYSTEM AND EXTERNAL SYSTEM OFF-STATE RECOGNITION METHOD USING SAME

(71) Applicant: LG CHEM, LTD., Seoul (KR)

(72) Inventors: Sung Ju Hong, Daejeon (KR); Jeong Wook Kim, Daejeon (KR); Jung Hyun Nam, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 158 days.

(21) Appl. No.: 16/958,941

(22) PCT Filed: Sep. 25, 2019

(86) PCT No.: PCT/KR2019/012462
§ 371 (c)(1),
(2) Date: Jun. 29, 2020

(87) PCT Pub. No.: WO2020/111481
PCT Pub. Date: Jun. 4, 2020

(65) Prior Publication Data
US 2020/0343759 A1 Oct. 29, 2020

(30) Foreign Application Priority Data
Nov. 27, 2018 (KR) .................. 10-2018-0148371

(51) Int. Cl.
*H02J 7/00* (2006.01)
*G01R 31/396* (2019.01)
(Continued)

(52) U.S. Cl.
CPC .... *H02J 7/007182* (2020.01); *G01R 31/3835* (2019.01); *G01R 31/396* (2019.01);
(Continued)

(58) Field of Classification Search
USPC .................................................. 320/134, 162
See application file for complete search history.

(56) References Cited

U.S. PATENT DOCUMENTS 5,557,188 A * 9/1996 Piercey ............... H02J 13/0003
320/152
5,990,665 A 11/1999 Kawata et al.
(Continued)

FOREIGN PATENT DOCUMENTS

JP     H6-38400 A    2/1994
JP     H10-271705 A   10/1998
(Continued)

OTHER PUBLICATIONS

Machine Translation of JP6305126B2 (Year: 2018).*
(Continued)

*Primary Examiner* — Samuel Berhanu
(74) *Attorney, Agent, or Firm* — Morgan, Lewis & Bockius LLP

(57) ABSTRACT

The present invention relates to a voltage recognition system of a starting battery and a method of recognizing an off state of an external system using the same, and more particularly, to a driving system of a starting battery and a method of recognizing an off state of an external system using the same, which make it possible to start an engine next time by recognizing the off state of the external system in an overvoltage state according to whether there occurs a difference between values of voltages measured by two ADCs having different positions of ground GND without requiring a current sensor.

13 Claims, 4 Drawing Sheets

(51) Int. Cl.
  *G01R 31/3835* (2019.01)
  *B60L 50/50* (2019.01)
  *B60L 58/12* (2019.01)
(52) U.S. Cl.
  CPC .......... *H02J 7/0013* (2013.01); *H02J 7/0047* (2013.01); *H02J 7/00308* (2020.01); *B60L 50/50* (2019.02); *B60L 58/12* (2019.02)

(56) References Cited

U.S. PATENT DOCUMENTS

| | | | |
|---|---|---|---|
| 10,637,262 | B2 | 4/2020 | Nakamoto et al. |
| 2007/0080661 | A1 | 4/2007 | Nakashima et al. |
| 2009/0115378 | A1 | 5/2009 | Ko |
| 2009/0256529 | A1* | 10/2009 | Wang .................. H02J 7/0031 320/162 |
| 2010/0253285 | A1* | 10/2010 | Takahashi ........... H02J 7/00038 320/134 |
| 2011/0205678 | A1* | 8/2011 | Baba .................... G06F 1/3212 361/86 |
| 2012/0112686 | A1* | 5/2012 | Zhang .................. H02J 7/0026 320/107 |
| 2012/0112705 | A1* | 5/2012 | Wang ........................ H02J 7/00 320/152 |
| 2013/0181681 | A1* | 7/2013 | Mukai .................. H02J 7/0048 320/128 |
| 2016/0241052 | A1 | 8/2016 | Yang |
| 2018/0041055 | A1 | 2/2018 | Nakamoto et al. |
| 2018/0115179 | A1* | 4/2018 | Fan ........................ H02J 50/10 |
| 2018/0123449 | A1 | 5/2018 | Nakamura et al. |
| 2020/0185784 | A1 | 6/2020 | Yeom |

FOREIGN PATENT DOCUMENTS

| | | |
|---|---|---|
| JP | 2001-327001 A | 11/2001 |
| JP | 2001-345699 A | 12/2001 |
| JP | 3539598 B2 | 7/2004 |
| JP | 10-0621072 B1 | 9/2006 |
| JP | 2010-193558 A | 9/2010 |
| JP | 4539431 B2 | 9/2010 |
| JP | 2010-246225 A | 10/2010 |
| JP | 2011-101517 A | 5/2011 |
| JP | 6068192 B2 | 1/2017 |
| JP | 2018-22665 A | 2/2018 |
| JP | 6305126 A | 4/2018 |
| JP | 6305126 B2 | 4/2018 |
| KR | 10-0621072 B1 | 9/2006 |
| KR | 10-2009-0047181 A | 5/2009 |
| KR | 10-1406542 B1 | 6/2014 |

OTHER PUBLICATIONS

Extended European Search Report dated Aug. 10, 2020, issued in corresponding European Patent Application No. 19890914.5.
International Search Report issued in corresponding International Patent Application No. PCT/KR2019/012462, dated Jan. 10, 2020.
Office Action dated Aug. 10, 2021, issued in corresponding Japanese Patent Application No. 2020-533598.
Notice of Allowance dated Nov. 22, 2021 for counterpart Japanese Patent Application No. 2020-533598.

* cited by examiner

STARTING BATTERY DRIVING SYSTEM AND EXTERNAL SYSTEM OFF-STATE RECOGNITION METHOD USING SAME

TECHNICAL FIELD

The present invention relates to a driving system of a starting battery and a method of recognizing an off state of an external system using the same, and more particularly, to a driving system of a starting battery, which makes it possible to recognize an off state of an external system without providing a current sensor to a battery management system (BMS) of the starting battery, and a method of recognizing an off state of an external system using the same.

BACKGROUND ART

Recently, with increased concern about environmental issues such as global warming, the necessity and request for reducing carbon dioxide emission, which is one of the main causes of environmental issues, have increased. Therefore, the demand for electric vehicles or electric two-wheeled vehicles which are driven with electricity is increasing.

Meanwhile, a starting battery is a battery for starting an engine, and is configured to be charged by an engine after the engine is started. Such a starting battery is mounted in an electric vehicle or electric two-wheeled vehicle to enable engine start, and is charged by an engine after the engine is started.

Here, when an engine is in an unregulated status, the problem of charging a starting battery up to a safety voltage or higher occurs. When a starting battery including lithium ion cells is charged to a safety voltage or higher, a dangerous situation such as explosion may occur. Thus, it is necessary to control so as to prevent a starting battery from being charged to a safety voltage or higher using a battery management system (BMS).

To this end, in general, the BMS is provided with a current sensor, and accurately recognizes a charging/discharging state through the magnitude and direction of a current using the current sensor to control a starting battery so as to prevent the starting battery from being charged to a safety voltage or higher. However, providing the current sensor to the BMS increases the cost, and thus such BMS may degrade price competitiveness.

(Patent Document 1) KR 10-2009-0047181 A1

DISCLOSURE OF THE INVENTION

Technical Problem

The present invention, which is intended to solve the above-described problem, provides a driving system of a starting battery and a method of recognizing an off state of an external system using the same, which are capable of improving price competitiveness by enabling execution of a function of a battery management system (BMS) without requiring a current sensor.

Technical Solution

A driving system of a starting battery according to the present invention includes: one or more battery cells; a voltage measurement unit, which measures a voltage of the battery cells; an overvoltage determination unit, which compares the voltage measured by the voltage measurement unit with a preset reference voltage to determine whether the battery cells are in an overvoltage state according to a result of comparison; a charging FET, which is configured in a first path that is a main path through which a charging current flow between the battery cells and an external system to control a flow of the charging current; first and second current limiting units, which are configured in a second path through which the charging current flows from the external system to the battery cells and which is formed in parallel with the first path to consume the charging current of the battery cells; a system off determination unit, which determines an off state of the external system to which the battery cells are connected on the basis of a change in a value of the voltage measured by the voltage measurement unit; and a charging FET control unit, which controls on/off of the charging FET configured in the first path according to determination results from the overvoltage determination unit and the system off determination unit.

Here, the voltage measurement unit includes a first voltage measurement unit and a second voltage measurement unit, and grounds GND of the first voltage measurement unit and the second voltage measurement unit are set in different positions.

In detail, the ground GND of the first voltage measurement unit is positioned in the first path, and the ground GND of the second voltage measurement unit is positioned between the first and second current limiting units configured in the second path.

Meanwhile, the overvoltage determination unit determines that the battery cells are in the overvoltage state when a voltage measured by the first voltage measurement unit exceeds the preset reference voltage, and outputs an overvoltage determination signal to the charging FET control unit, and the charging FET control unit turns off the charging FET upon receiving the overvoltage determination signal from the overvoltage determination unit.

Accordingly, when the charging FET is turned off by the charging FET control unit, the charging current that was flowing to the battery cells through the first path flows through the second path.

Meanwhile, the first and second current limiting units configured in the second path consume the charging current flowing through the second path to prevent the battery cells from being overcharged.

Accordingly, when the charging current of the battery cells flows through the second path, the first and second current limiting units cause occurrence of a difference between values of voltages respectively measured by the first and second voltage measurement units.

Meanwhile, the system off determination unit includes: an overvoltage state recognition unit, which recognizes the overvoltage state of the battery cells by detecting that the overvoltage determination signal is output from the overvoltage determination unit, and outputs an overvoltage state signal; and a voltage difference detection unit, which detects, when it is recognized that the battery cells are in the overvoltage state on the basis of the overvoltage state signal output from the overvoltage state recognition unit, whether a difference occurs between the values of the voltages respectively measured by the first and second voltage measurement units to determine an off state of the external system.

In detail, the voltage difference detection unit determines that the external system is in an off state when it is detected that the voltages respectively measured by the first and second voltage measurement units have changed to a state in which there occurs no difference between the voltages, and outputs a system off signal to the charging FET control unit.

Accordingly, the charging FET control unit turns on the charging FET upon receiving the system off signal from the voltage difference detection unit.

Meanwhile, each of the first and second current limiting units is configured with a bypass resistor.

A method of recognizing an off state of an external system in an overvoltage state of battery cells in a driving system of a starting battery as described above includes: a voltage measurement step in which the first and second voltage measurement units measure a voltage of each of the battery cells; an overvoltage determination step in which the overvoltage determination unit compares the voltage measured by the first voltage measurement unit through the voltage measurement step with a preset reference voltage to determine whether the measured voltage exceeds the preset reference voltage to determine whether the battery cells are in the overvoltage state according to a result of comparison; a charging FET off control step in which, when the battery cells are determined to be in the overvoltage state through the overvoltage determination step, the charging FET control unit turns off the charging FET configured in the first path to control the charging current flowing from the external system to the battery cells; a voltage value sameness detection step in which the system off determination unit detects whether the voltages respectively measured by the first and second voltage measurement units have the same value when the charging FET configured in the first path is turned off through the charging FET off control step; a system off determination step in which, when it is detected that the voltages respectively measured by the first and second voltage measurement units have the same value in the voltage value sameness detection step, it is determined that the external system is in the off state; and a charging FET on control step in which, when it is determined that the external system is in the off state in the system off determination step, the charging FET control unit turns on the charging FET configured in the first path.

Here, in the charging FET off control step, when the charging current flows through the second path since the charging FET configured in the first path is turned off, the values of the voltages respectively measured by the first and second voltage measurement units are different from each other due to the first and second current limiting units provided in the second path.

Advantageous Effects

According to the present invention, an off state of a system can be recognized in an overvoltage state of a battery without providing a current sensor to a battery management system (BMS), and thus the price competitiveness of a battery can be improved.

Furthermore, a battery can be stably operated since a control can be performed so as to enable next start by recognizing an off state of system in an overvoltage state of the battery.

MODE FOR CARRYING OUT THE INVENTION

Figure 1:
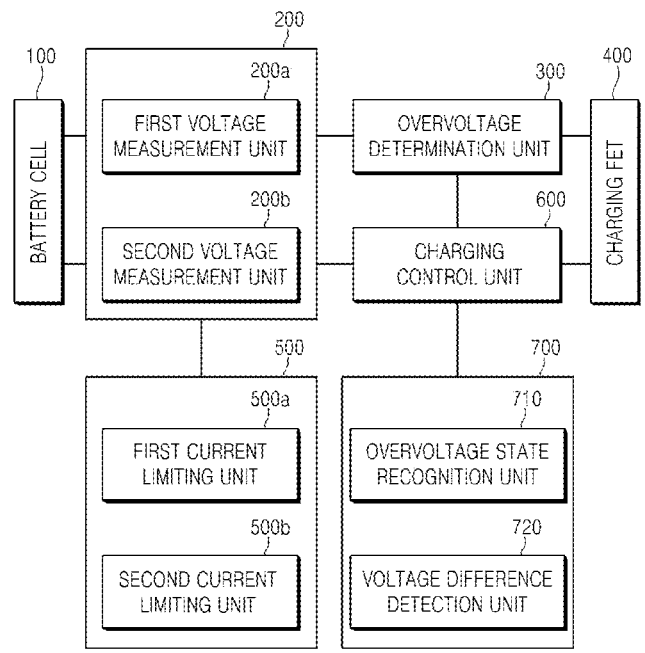
FIG. 1 is a block diagram schematically illustrating an overall system configuration according to an embodiment of the present invention.

Hereinafter, embodiments of the present invention will be described in detail with reference to the accompanying drawings so that those of ordinary skill in the art can easily carry out the present invention. However, the present invention may be implemented in various different forms and is not limited to the embodiments described herein. Some parts of the embodiments, which are not related to the description, are not illustrated in the drawings in order to clearly describe the embodiments of the present invention. Like reference numerals refer to like elements throughout the description.

The term "first", "second" or the like may be used for describing various elements but does not limit the elements. Such terms are only used for distinguishing one element from other elements. For example, without departing the scope of the present invention, a first element may be referred to as a second element, and likewise, a second element may be referred to as a first element. The terminology used herein is not for delimiting the present invention but for describing specific embodiments. The terms of a singular form may include plural forms unless otherwise specified.

In the entire description, when one part is referred to as being "connected" to another part, the former may be "directly connected" to the latter or "electrically connected" thereto via an intervening other part. When it is mentioned that a certain part "includes" or "comprises" certain elements, the part may further include other elements, unless otherwise specified. The term "step (ing) . . . " or "step of . . . " used herein does not represent "step for . . . ".

The terms used herein have been selected from among general terms that are widely used at the present time in consideration of the functions of the present invention, but may be changed depending on intentions of those skilled in the art, judicial precedents, or the advent of new technology. Furthermore, specific terms have been arbitrarily selected by the applicant, and the meanings of such terms will be described in detail in relevant sections of the description. Therefore, it should be understood that the terms used herein should not be simply defined literally but should be defined on the basis of the meanings of the terms and the overall contents of the present disclosure.

Hereinafter, the present invention will be described in detail with reference to the drawings.

1. Driving System of a Starting Battery According to the Present Invention

The present invention includes one or more battery cells 100 connected in series or in parallel. The battery cells 100 supply a charging current for starting an engine of an electric vehicle or an electric two-wheeled vehicle, and are charged by the engine after the starting.

1.2. Voltage Measurement Unit 200

Figure 2:
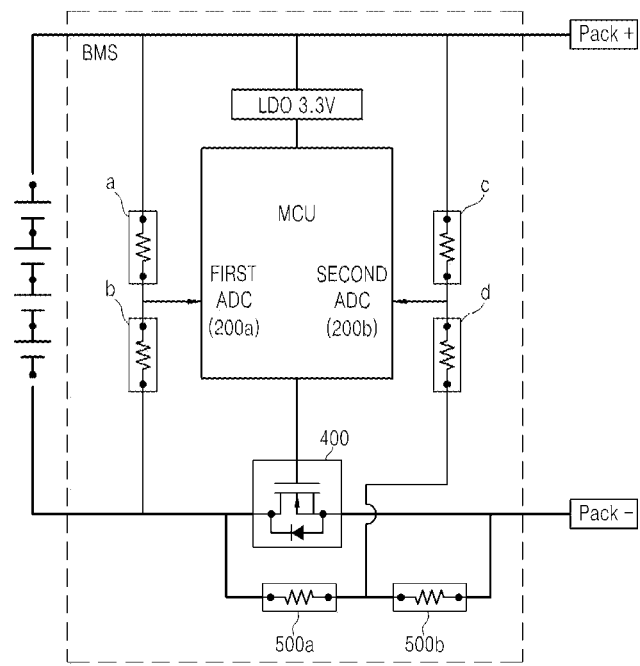
FIG. 2 is an actual circuit diagram according to an embodiment of the present invention.

The voltage measurement unit, which measures voltage of the battery cells 100, may include a first voltage measurement unit 200a and a second voltage measurement unit 200b. Here, as shown in FIG. 2, the first voltage measurement unit 200a and the second voltage measurement unit 200*b* may measure the same voltage, but grounds GND thereof may be connected to different positions.

Here, each of the first and second voltage measurement units 200*a* and 200*b* may be an analog-to-digital converter (ADC).

In detail, the ground GND of the first voltage measurement unit 200*a* may be connected to a cell ground GND, and the ground GND of the second voltage measurement unit 200*b* may be connected between first and second current limiting units 500*a* and 500*b* including bypass resistors described below. The grounds GND of the first voltage measurement unit 200*a* and the second voltage measurement unit 200*b* are connected to different positions in order to recognize an off state of an external system in an overvoltage state of the battery cells 100 according to whether a voltage difference between the first and second voltage measurement units 200*a* and 200*b* occurs through this connection. Relevant detailed description will be provided when describing the system off determination unit 700 described below.

1.3. Overvoltage Determination Unit 300

The overvoltage determination unit compares the voltage of the battery cells 100 measured by the voltage measurement unit 200 with a preset reference voltage to determine whether the battery cells 100 are in an overvoltage state according to a result of the comparison.

When the voltage measured by the voltage measurement unit 200 exceeds the reference voltage as a result of the comparison, the overvoltage determination unit may determine that the battery cells 100 are in an overvoltage state, and may output a determination result to a charging FET control unit 600 and an overvoltage state recognition unit 710 described below.

Here, it may be preferable that the overvoltage determination unit uses a voltage measured by the first voltage measurement unit 200*a* to determine an overvoltage state of the battery cells 100. Values of the voltages respectively measured by the first and second voltage measurement units 200*a* and 200*b* having different positions of ground GND are different when a charging current flows through a second path since the charging FET 400 is turned off due to overvoltage determination. Thus, it may be preferable that the voltage measured by the first voltage measurement unit 200*a* is used to determine a voltage state of the battery cells 100 considering that a normal state is determined after determining an overvoltage state although the values of the voltages respectively measured by the first and second voltage measurement units 200*a* and 200*b* are the same before determining an overvoltage state.

1.4. Charging FET 400

The charging FET controls a flow of charging current from an engine of an external system such as an electric vehicle or an electric two-wheeled vehicle to the battery cells 100 or from the battery cells 100 to the external system, and may be controlled to be turned on/off by a charging FET control unit 600 described below.

Figure 3:
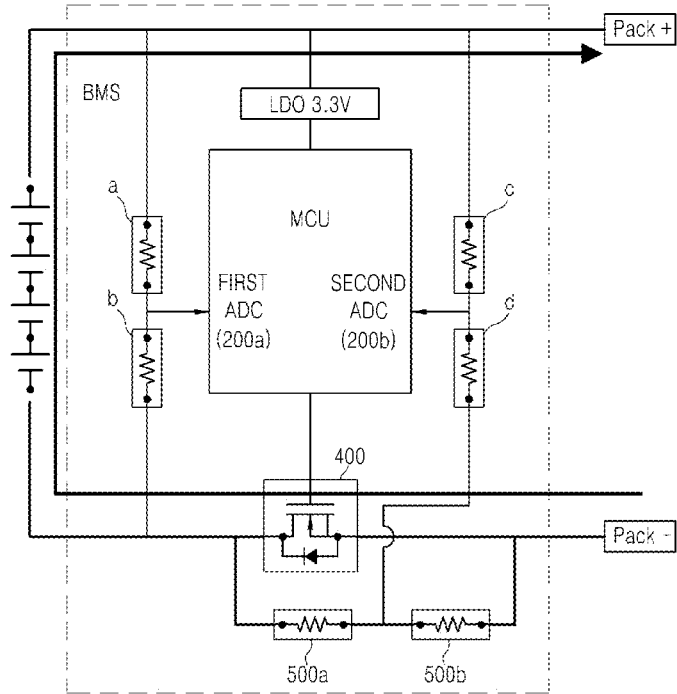
FIGS. 3 through 5 are diagrams illustrating a state of each charging current flow illustrated in FIG. 2.
Figure 4:
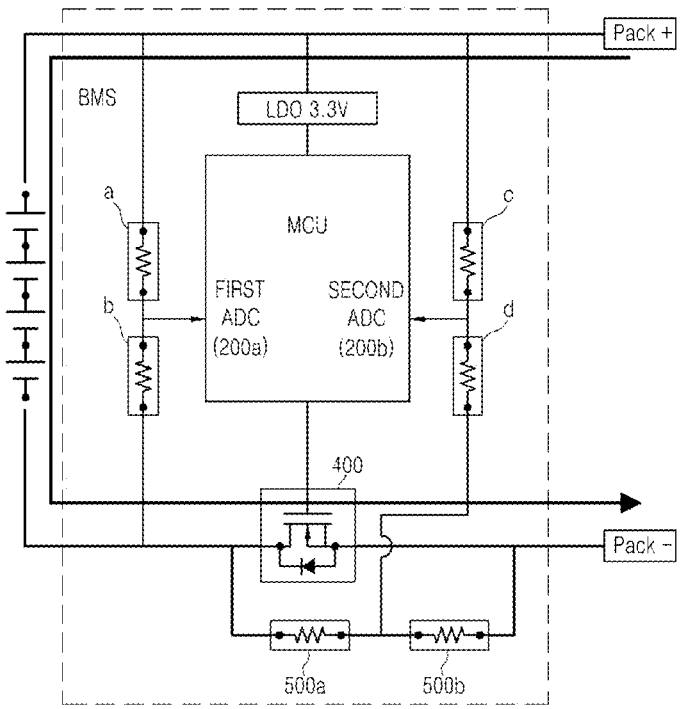

The present invention is a starting battery for supplying power for starting an engine of an external system such as an electric vehicle or an electric two-wheeled vehicle. Thus, a charging current flows from the battery cells 100 to the external system so that the charging current for starting the engine flows as illustrated in FIG. 3 when starting the engine, and, after starting the engine, the charging current flows from the external system to the battery cells 100 as illustrated in FIG. 4 so that the battery cells 100 may be charged by the engine.

Here, the charging FET may be configured in a first path that is a main charging path as shown in FIG. 2, and may be turned on/off by the charging FET control unit 600 described below so as to control a flow of the charging current.

1.5. Current Limiting Unit 500

The current limiting unit may include first and second current limiting units 500*a* and 500*b*. As shown in FIG. 2, the current limiting unit may be configured in the second path that is different from the first path in which the charging FET 400 is configured, so as to consume a charging current of the battery cells 100 to thereby prevent the battery cells 100 from being overcharged.

In detail, the second path in which the first and second current limiting units 500*a* and 500*b* are configured is formed in parallel with the first path that is the main path through which a charging current flows from an external system to the battery cells 100, so as to allow the charging current to flow when the charging FET 400 configured in the first path is turned off. When the overvoltage determination unit 300 determines that the battery cells 100 have an overvoltage, the charging current flows through the second path when the charging FET 400 is turned off by the charging FET control unit 600 described below. Here, the charging current flowing through the battery cells 100 are consumed by the first and second current limiting units 500*a* and 500*b* configured in the second path so that the battery cells 100 may be prevented from being overcharged. Here, the first and second current limiting units 500*a* and 500*b* are configured with bypass resistors. That is, since the first and second current limiting units 500*a* and 500*b* including bypass resistors consume the charging current of the battery cells 100 by as much as corresponding resistor values, the battery cells 100 may be prevented from being overcharged.

In brief, the first path is the main path through which a charging current flows, and the second path is a path through which the charging current flows when the charging FET 400 configured in the first path is turned off, wherein the first and second current limiting units 500*a* and 500*b* including bypass resistors are configured in the second path to consume the charging current of the battery cells 100 to thereby prevent the battery cells 100 from being overcharged.

Here, the ground GND of the second voltage measurement unit 200*a* of the voltage measurement unit 200 described above may be described as being positioned between the first and second current limiting units 500*a* and 500*b* including bypass resistors.

1.6. Charging FET Control Unit 600

As described above, the charging FET control unit may control on/off of the charging FET 400 according to a determination result from the overvoltage determination unit 300.

As described above, when an overvoltage determination signal is output from the overvoltage determination unit 300, the charging FET control unit may recognize that the battery cells 100 are in an overvoltage state, and may turn off the charging FET 400 in order to block the charging current flowing from an external system to the first path.

On the contrary, in a state in which the overvoltage determination signal is not output from the overvoltage determination unit 300, i.e., in a normal state, the charging FET 400 may be turned on so as to allow the charging current from an external system to flow through the first path that is the main path.

Furthermore, when a system off signal is output from the system off determination unit 700 described below, the charging FET control unit may turn on the charging FET 400.

The system off signal output from the system off determination unit 700 indicates that an external system is turned off in a state in which the charging FET 400 is turned off due to determination of an overcharge state of the battery cells 100, and thus the charging FET 400 may be turned on again. Accordingly, the charging current may be allowed to flow from the battery cells 100 to an engine of an external system to enable engine start when starting the engine next time.

Relevant detailed description will be provided in relation to the system off determination unit 700 described below.

1.7. System Off Determination Unit 700

In a state in which the overvoltage determination unit 300 has determined that the battery cells 100 are in an overvoltage state, the system off determination unit detects whether there is a difference between the voltages respectively measured by the first and second voltage measurement units 200*a* and 200*b* of the voltage measurement unit 200, and determines that an external system is in an off state according to a result of the detection. The system off determination unit may include specific elements as below.

A. Overvoltage State Recognition Unit 710

The overvoltage state recognition unit may recognize an output of the overvoltage determination signal from the overvoltage determination unit 300 to recognize an overvoltage state of the battery cells 100. When the overvoltage determination signal is output from the overvoltage determination unit 300, the overvoltage state recognition unit may determine that the battery cells 100 are in an overvoltage state, and may output an overvoltage state signal.

B. Voltage Difference Detection Unit 720

In a state in which the overvoltage state recognition unit 710 has recognized that the battery cells 100 are in an overvoltage state, the voltage difference detection unit detects whether there occurs a difference between the voltages respectively measured by the first and second voltage measurement units 200*a* and 200*b* of the voltage measurement unit 200.

In detail, the voltage difference detection unit may receive the overvoltage state signal output from the overvoltage state recognition unit 710. Upon receiving the overvoltage state signal, the voltage difference detection unit compares the values of the voltages respectively measured by the first and second voltage measurement units 200*a* and 200*b* of the voltage measurement unit 200 after elapse of a predetermined time from the time of the input of the overvoltage state signal so as to detect whether there occurs a difference between the two voltages. When no difference is detected between the voltages of the first and second voltage measurement units 200*a* and 200*b* as a result of the comparison, the voltage difference detection unit may determine that an external system is turned off in an overvoltage state of the battery cells 100, and may output the system off signal to the charging FET control unit 600. Accordingly, the charging FET control unit 600 that has received the system off signal turns on the charging FET 400 so as to enable engine start by allowing a charging current to flow from the battery cells 100 to an engine when turning on power of an external system next time.

Here, the voltage difference detection unit detects whether there occurs a difference between the voltages of the first and second voltage measurement units 200*a* and 200*b* after elapse of the predetermined time from the time of the input of the overvoltage state signal, considering the time taken for the values of the voltages respectively measured by the first and second voltage measurement units 200*a* and 200*b* to become different since the charging current that was flowing through the first path flows through the second path when the charging FET 400 is turned off due to determination of an overcharge state. Accordingly, the voltage difference detection unit may more accurately detect a state in which the values of the voltages of the first and second voltage measurement units 200*a* and 200*b* become equal, i.e., there occurs no difference therebetween, and thus may accurately determine that a system has been turned off in an overvoltage state.

Here, the fact that the external system has been turned off may indicate that an electric vehicle or an electric two-wheeled vehicle is in a turned off state, and enabling the power of the external system to be turned on may indicate that next start is enabled in a turned off state.

That is, the present invention relates to a starting battery, which is mounted in an external system such as an electric vehicle or an electric two-wheeled vehicle to supply power for starting an engine, and is charged by the engine after the engine is started. Here, when the external system is turned off (ignition off) in a state in which the charging FET 400 is turned off, it is necessary to turn on the FET 400 again to enable engine start next time. Therefore, when no difference is detected between the values of the voltages measured by the first and second voltage measurement units 200*a* and 200*b* of the voltage measurement unit 200 in an overvoltage state of the battery cells 100, i.e., in a state in which the charging FET 400 is turned off, the system off determination unit 700 determines that an external system is turned off, and outputs the system off signal to the charging FET control unit 600 to turn on the charging FET 400 so as to enable next start.

The principle of determining, as a turned off state of an external system, the state in which the first and second voltage measurement units 200*a* and 200*b* measure the same voltage value in an overvoltage state of the battery cells 100, as described above, will be described.

Figure 5:
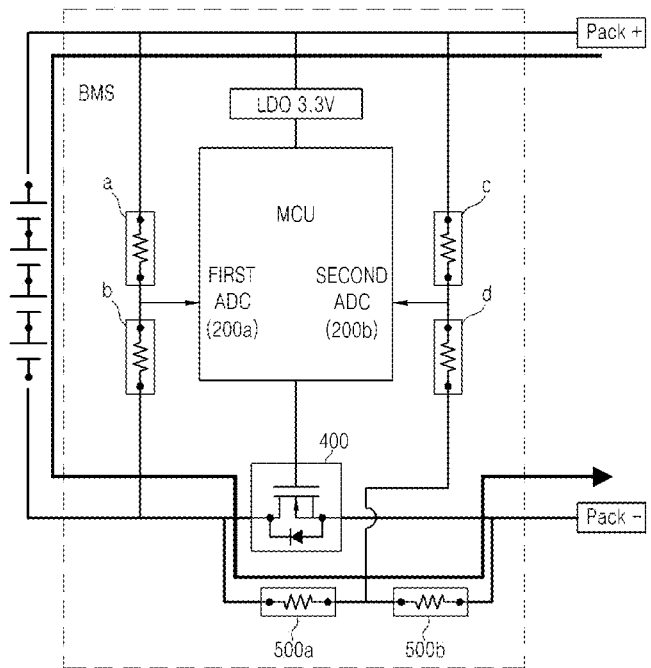
Figure 6:
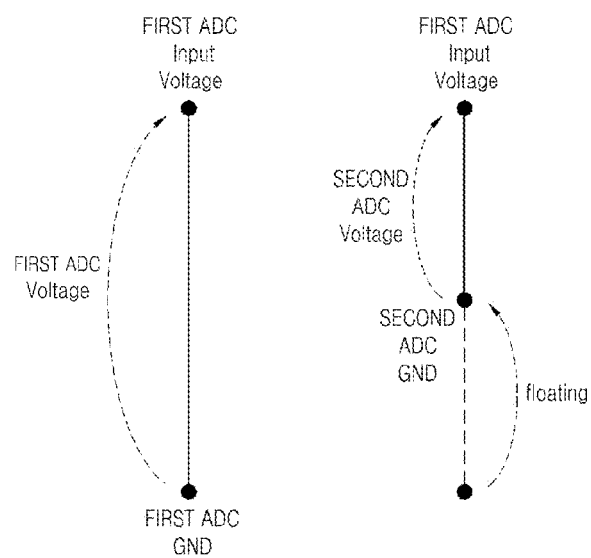
FIG. 6 is a diagram for describing a principle of occurrence of a voltage difference between first and second ADCs.

First, after an engine of an external system is started by supplying a charging current from the battery cells 100 to the engine via the charging FET 400 that is turned on in the first path as illustrated in FIG. 3, the charging current may be supplied from the engine to the battery cells 100 so that the battery cells 100 may be charged as illustrated in FIG. 4. In the states of FIGS. 3 and 4, the charging current flows through the first path that is the main path, and thus the flowing charging current is hardly limited by resistor, and the first and second voltage measurement units 200*a* and 200*b* measure the same voltage value. In this state, when the charging FET 400 is turned off since the overvoltage determination unit 300 determines that an overvoltage state has occurred, the charging current that was flowing through the first path flows through the second path in which the first and second current limiting units 500*a* and 500*b* including bypass resistors are configured as illustrated in FIG. 5 in order to prevent the battery cells 100 from being overcharged. When the charging current flows through only the second path as described above, a voltage is loaded on the first and second current limiting units 500*a* and 500*b* while the charging current is flowing therethrough, and is reversed to +, −, causing a floating phenomenon of the ground GND, since the ground GND of the first voltage measurement unit 200*a* is the cell ground GND, but the ground GND of the second voltage measurement unit 200*b* is positioned between the first and second current limiting units 500*a* and 500*b*. Accordingly, as illustrated in FIG. 6, although the first ADC 200*a* and the second ADC 200*b* actually measure the same voltage, the ground GND of the second ADC 200*b* is floated, and a reference changes as much as the degree to which the second ADC 200*b* is floated, thus causing a difference from the value of the voltage read by the first voltage measurement unit 200*a*. As a result, there occurs a difference between the values of the voltages of the first and second voltage measurement units 200a and 200b.

Therefore, in a state in which the charging current flows through the first path as illustrated in FIGS. 3 and 4, the values of the voltages measured by the first and second voltage measurement units 200a and 200b are the same, and in a state in which the charging current flows through the second path since the charging FET 400 is turned off as illustrated in FIG. 5, i.e., in an overvoltage state, the ground GND of the second voltage measurement unit 200b is floated by the first and second current limiting units 500a and 500b configured in the second path, and thus there occurs a difference between the values of the voltages measured by the first and second voltage measurement units 200a and 200b.

Here, since a current changes according to an output of the external system, the voltage loaded on the first and second current limiting units 500a and 500b also changes, and thus the degree to which the ground GND of the second voltage measurement unit 200b is floated may vary.

When the external system is turned off in the state illustrated in FIG. 5, there occurs no difference between the values of the voltages measured by the first and second voltage measurement units 200a and 200b since no current flows.

Therefore, the present invention may use the above-described principle to determine that the external system is turned off by detecting that the voltages of the first and second voltage measurement units 200a and 200b are equal without having a difference in an overvoltage state.

Here, the state in which the external system is turned off may represent a state in which an engine is turned off.

In this manner, the present invention may recognize, without having a current sensor, the state in which the external system is turned off in an overvoltage state according to whether there occurs a difference between the values of the voltages measured by the first and second voltage measurement units 200a and 200b by providing a path in which the first and second current limiting units 500a and 500b including bypass resistors are configured and by connecting the grounds GND of the first and second voltage measurement units 200a and 200b to different positions, and thus enables a following control that enables next engine start, thereby improving price competitiveness and efficiency.

Here, it may be necessary to design such that distributed resistance (a, b, c, d) values of the first and second voltage measurement units 200a and 200b and resistance values of the first and second current limiting units 500a and 500b have a sufficiently large difference. The reason is that the voltages measured by the first and second voltage measurement units 200a and 200b are required to have almost the same value to use the above-described principle, but the unit of distributed resistance of each voltage measurement unit is 10 to the power of 6 ohms, and the first and second current limiting units 500a and 500b, which are bypass resistors, have the unit of 10 to the power of 0 ohms, and thus there is a ten thousand times difference therebetween. Therefore, in order to make it possible to recognize a system off state in an overvoltage state using the above-described principle, it is necessary to design, in consideration of the above issue, such that the distributed resistance (a, b, c, d) values of the voltage measurement units, each of which is configured with an ADC, and the resistance values of the first and second current limiting units 500a and 500b have a sufficiently large difference.

Figure 7:
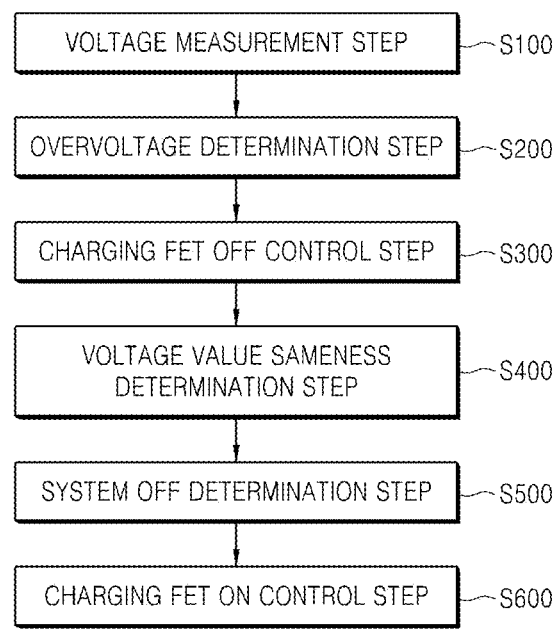
FIG. 7 is a block diagram schematically illustrating a method according to an embodiment of the present invention.

2. Method of Recognizing an Off State of an External System Using a Driving System of a Starting Battery According to the Present Invention Referring to FIG. 7, the method of recognizing an off state of an external system according to the present invention may include the following steps.

2.1. Voltage Measurement Step S100

The voltage measurement step, which is a step of measuring the voltage of the battery cells 100, may be performed by the first and second voltage measurement units 200a and 200b, each of which is configured with an ADC.

2.2. Overvoltage Measurement Step S200

The overvoltage determination step is a step of comparing the voltage measured in the voltage measurement step S100 with a preset reference voltage to determine whether the battery cells 100 are in an overvoltage state according to a result of the comparison. When the voltage measured in the voltage measurement step S100 exceeds the preset reference voltage, the battery cells 100 may be determined to be in an overvoltage state, and an overvoltage state signal may be output.

This overvoltage determination step may be performed by the above-described overvoltage determination unit 300.

2.3. Charging FET Off Control Step S300

In this step, the charging FET 400 configured in a first path that is a main charging path is controlled to be turned off in order to block a charging current flowing from an external system such as an electric vehicle or an electric two-wheeled vehicle to the battery cells 100 via the first path when the overvoltage determination signal is output since the battery cells 100 are determined to be in an overvoltage state in the overvoltage determination step S200. Overcharging may be prevented through this step since the charging current that was flowing from the external system to the battery cells 100 via the first path as illustrated in FIG. 4 flows through a second path in which the first and second current limiting units 500a and 500b including bypass resistors are configured as illustrated in FIG. 5 so that the current is limited by the first and second current limiting units 500a and 500b, thus reducing the charging current of the battery cells 100.

This charging FET off control step may be performed by the charging FET control unit 600 that has received the overvoltage determination signal from the overvoltage determination unit 300.

2.4. Voltage Value Sameness Detection Step S400

In the voltage value sameness detection step, when the charging current flowing from the external system to the battery cells 100 flows through the second path in which the first and second current limiting units 500a and 500b are configured through the charging FET off control step S300, the values of the voltages respectively measured by the first and second voltage measurement units 200a and 200b through the voltage measurement step S100 are compared to detect whether the two voltages are in the same state.

As described above, when the charging FET 400 configured in the first path is blocked through the charging FET off control step S300, the charging current flows through the second path in which the first and second current limiting units 500a and 500b are configured as illustrated in FIG. 5. Here, since the first voltage measurement unit 200a has the cell ground GND, and the ground GND of the second voltage measurement unit 200b is positioned between the first and second current limiting units 500a and 500b, when the charging current flows through the second path as illustrated in FIG. 5, the ground GND of the second voltage measurement unit 200b is floated by the first and second current limiting units 500a and 500b, causing occurrence of a difference between the values of the voltages respectively measured by the first and second voltage measurement units 200a and 200b. When the external system is turned off in this state, i.e., when an engine is turned off, no current flows, and thus the values of the voltages of the first and second voltage measurement units 200a and 200b become the same.

Therefore, the values of the voltages measured by the first and second voltage measurement units 200a and 200b are different in the charging FET off control step S300, and in this state, it is detected that no difference occurs between the two voltages through the voltage difference detection step. Since this principle has been described in relation to a system configuration, detailed description is omitted.

This voltage sameness detection step may be performed by the above-described system off determination unit 700.

2.5. System Off Determination Step S500

In this step, a state in which the system is turned off is determined according to a result of the voltage difference detection in the voltage value sameness detection step S400. When it is detected that the voltages measured by the first and second voltage measurement units 200a and 200b have the same value through the voltage value sameness detection step S400, it may be determined that the system is in a turned off state. Since this state indicates that the system is turned off in an overvoltage state in which the charging FET 400 configured in the first path is turned off through the charging FET off control step S300, it is necessary to turn on the turned-off charging FET 400 in order to supply the charging current from the battery cells 100 to the external system for starting the engine next time. Therefore, in the system off determination step performed by the above-described system off determination unit 700, when it is determined that the system is turned off, a system off signal may be output to the charging FET control unit 600 so that the charging FET on control step S600 described below may be performed.

2.6. Charging FET on Control Step S600

In the charging FET on control step, the charging FET control unit 600 that has received the system off signal from the system off determination unit 700 since the system was determined to be turned off in the system off determination step S500 turns on the turned-off charging FET 400 configured in the first path.

Since the charging FET 400 is turned on through the charging FET on control step, the charging current may be supplied from the battery cells 100 to the external system via the first path to enable engine start when starting the engine next time.

Through the steps as described above, the present invention may recognize a state in which the external system is turned off in an overvoltage state of a battery, i.e., may recognize a state in which the engine is turned off without having a current sensor as in the prior art, thereby enabling a control that enables next engine start. Thus, the effect of reducing the cost caused by providing a current sensor may be bring about, thereby improving the price competitiveness.

Although the technical concept of the present invention has been specifically described according to the above-mentioned embodiment, it should be noted that the above-mentioned embodiment is not for limiting the present invention but for describing the present invention. Furthermore, those skilled in the art could understand that various embodiments can be made within the scope of the technical concept of the present invention.

What is claimed is:

1. A driving system of a starting battery, the driving system comprising:
   one or more battery cells;
   a voltage measurement unit configured to measure a voltage of the battery cells;
   an overvoltage determination unit configured to compare the voltage measured by the voltage measurement unit with a preset reference voltage to determine whether the battery cells are in an overvoltage state according to a result of the comparison;
   a charging field-effect transistor (FET) configured in a first path that is a main path through which a charging current flow between the battery cells and an external system to control a flow of the charging current;
   first and second current limiting units configured in a second path through which the charging current flows from the external system to the battery cells, and formed in parallel with the first path to consume the charging current of the battery cells;
   a system off determination unit configured to determine an off state of the external system to which the battery cells are connected based on a change in a value of the voltage measured by the voltage measurement unit; and
   a charging FET control unit configured to control on/off of the charging FET configured in the first path according to determination results from the overvoltage determination unit and the system off determination unit.

2. The driving system of claim 1, wherein:
   the voltage measurement unit comprises:
   a first voltage measurement unit; and
   a second voltage measurement unit; and
   respective grounds (GND) of the first voltage measurement unit and the second voltage measurement unit are set in different positions.

3. The driving system of claim 2, wherein:
   the ground GND of the first voltage measurement unit is positioned in the first path; and
   the ground GND of the second voltage measurement unit is positioned between the first and second current limiting units configured in the second path.

4. The driving system of claim 3, wherein:
   the overvoltage determination unit is further configured to:
   determine that the battery cells are in the overvoltage state when a voltage measured by the first voltage measurement unit exceeds the preset reference voltage; and
   output an overvoltage determination signal to the charging FET control unit; and
   the charging FET control unit is further configured to turn off the charging FET upon receiving the overvoltage determination signal from the overvoltage determination unit.

5. The driving system of claim 4, wherein, when the charging FET is turned off by the charging FET control unit, the charging current, that was flowing to the battery cells through the first path, flows through the second path.

6. The driving system of claim 5, wherein the first and second current limiting units configured in the second path are configured to consume the charging current flowing through the second path to prevent the battery cells from being overcharged.

7. The driving system of claim 6, wherein, when the charging current of the battery cells flows through the second path, the first and second current limiting units are further configured to cause occurrence of a difference between values of voltages respectively measured by the first and second voltage measurement units.

8. The driving system of claim 7, wherein the system off determination unit comprises:
   an overvoltage state recognition unit configured to:
      recognize the overvoltage state of the battery cells by detecting that the overvoltage determination signal is output from the overvoltage determination unit; and output an overvoltage state signal; and
   a voltage difference detection unit configured to detect, when it is recognized that the battery cells are in the overvoltage state based on the overvoltage state signal output from the overvoltage state recognition unit, whether a difference occurs between the values of the voltages respectively measured by the first and second voltage measurement units to determine an off state of the external system.

9. The driving system of claim 8, wherein the voltage difference detection unit is further configured to:
   determine that the external system is in an off state when it is detected that the voltages respectively measured by the first and second voltage measurement units have changed to a state in which there occurs no difference between the voltages; and
   output a system off signal to the charging FET control unit.

10. The driving system of claim 9, wherein the charging FET control unit is further configured to turn on the charging FET upon receiving the system off signal from the voltage difference detection unit.

11. The driving system of claim 6, wherein each of the first and second current limiting units comprises a bypass resistor.

12. A method of recognizing an off state of an external system in an overvoltage state of battery cells in a system according to claim 1, the method comprising:
   a voltage measurement step in which a first voltage measurement unit and a second voltage measurement unit measure a voltage of each of the battery cells;
   an overvoltage determination step in which the overvoltage determination unit compares the voltage measured by the first voltage measurement unit through the voltage measurement step with a preset reference voltage to determine whether the measured voltage exceeds the preset reference voltage to determine whether the battery cells are in the overvoltage state according to a result of the comparison;
   a charging FET off control step in which, when the battery cells are determined to be in the overvoltage state through the overvoltage determination step, the charging FET control unit turns off the charging FET configured in the first path to control the charging current flowing from the external system to the battery cells;
   a voltage value sameness detection step in which the system off determination unit detects whether the voltages respectively measured by the first and second voltage measurement units have the same value when the charging FET configured in the first path is turned off through the charging FET off control step;
   a system off determination step in which, when it is detected that the voltages respectively measured by the first and second voltage measurement units have the same value in the voltage value sameness detection step, it is determined that the external system is in the off state; and
   a charging FET on control step in which, when it is determined that the external system is in the off state in the system off determination step, the charging FET control unit turns on the charging FET configured in the first path.

13. The method of claim 12, wherein, in the charging FET off control step, when the charging current flows through the second path since the charging FET configured in the first path is turned off, the values of the voltages respectively measured by the first and second voltage measurement units are different from each other due to the first and second current limiting units provided in the second path.

* * * * *